United States Patent [19]

Miura

[11] Patent Number: 5,369,611
[45] Date of Patent: Nov. 29, 1994

[54] MEMORY WITH SELECTIVELY ACTIVE INPUT/OUTPUT BUFFERS

[75] Inventor: Naoki Miura, Tokyo, Japan

[73] Assignee: Oki Electric Industry Co., Ltd., Tokyo, Japan

[21] Appl. No.: 26,442

[22] Filed: Mar. 4, 1993

[30] Foreign Application Priority Data

Mar. 9, 1992 [JP] Japan .................................. 4-050866

[51] Int. Cl.$^5$ .............................................. G11C 7/00
[52] U.S. Cl. .................. 365/189.05; 365/190; 365/195
[58] Field of Search ............. 365/189.05, 195, 189.01, 365/190, 203

[56] References Cited

U.S. PATENT DOCUMENTS

| | | | |
|---|---|---|---|
| 4,669,064 | 5/1987 | Ishimoto | 365/189.05 |
| 4,742,487 | 5/1988 | Bernstein | 365/195 X |
| 4,760,562 | 7/1988 | Ohtani | 365/190 |
| 4,982,366 | 1/1991 | Takemae | 365/195 |
| 5,003,510 | 3/1991 | Kamisaki | 365/189.05 X |
| 5,073,872 | 12/1991 | Masuda et al. | 365/189.05 |

FOREIGN PATENT DOCUMENTS

179984 9/1985 Japan .

*Primary Examiner*—Eugene R. LaRoche
*Assistant Examiner*—Son Dinh
*Attorney, Agent, or Firm*—Edward D. Manzo

[57] ABSTRACT

In a random access memory comprising pairs of input-/output bus lines ($7_0$ to $7_3$) transferring write data to the memory cells ($3a$) and read data from the memory cells, input/output terminals ($10_0$ to $10_3$) corresponding to the pairs of input/output bus lines, and input/output buffer circuits ($9_0$ to $9_3$) respectively corresponding to the input/output terminals and also corresponding to said input/output terminals, an access control signal is applied to the input/output terminal ($10_0$) in a period in which the input/output terminal is not used for input or output of write data or read data, and transfer of read data through each of the input/output buffer circuits is permitted or inhibited on the basis of the access control signal.

24 Claims, 6 Drawing Sheets

MEMORY WITH SELECTIVELY ACTIVE INPUT/OUTPUT BUFFERS

BACKGROUND OF THE INVENTION

The present invention relates to a random access memory (RAM) having multiple-bit input/output (I/O) terminals, and in particular to a RAM which can operate in a mode in which reading through designated I/O terminals is enabled or permitted while reading through other I/O terminals is inhibited.

An example of conventional RAM having multiple-bit I/O terminals that is disclosed in Japanese Patent Kokai Publication No. 179984/1985 will first be described with reference to FIG. 2.

The RAM comprises a memory cell array 3 which comprises a matrix of memory cells 3a formed of a MOS transistor and connected to a plurality of word lines WL and a plurality of pairs of bit lines BL intersecting the word lines. Sense amplifiers not shown are connected to the respective pairs of bit lines to sense and amplify data read from the memory cells.

The illustrated RAM is of a multiple-address type using a row control signal $\overline{RAS}$, and a column control signal $\overline{CAS}$. A row address buffer 1 is controlled by the row control signal $\overline{RAS}$ to read a row address from the address signals A0, A1, ..., An which are supplied from outside of the RAM, and its output is connected to the memory cell array 3, via a row address decoder 2 which decodes the output of the row address buffer 1.

A column address buffer 4 is controlled by the column control signal $\overline{CAS}$ to read a column address from the address signals A0, A1, ..., An, and its output is connected to the memory cell array 3, via a column address decoder 5 and a transfer gate circuit 6. The column address decoder 5 decodes the output of the column address buffer 4. The transfer gate circuit 6 is formed of a plurality of pairs of switches for selectively connecting the pairs of bit lines BL with four pairs of I/O bus lines $7_0$ to $7_3$, on the basis of the output of the column decoder 5. As the pairs of switches are selected by the column address, the pairs of bit lines connected to the selected switches are connected to the I/O bus lines, and in this way "selected". Since there are four pairs of I/O bus lines, four of the pairs of bit lines are selected at a time and connected to the I/O bus lines.

Connected to the I/O bus lines are data amplifiers $8_0$ to $8_3$, and I/O buffer circuits $9_0$ to $9_3$. Connected to the I/O buffer circuits $9_0$ to $9_3$ are I/O terminals $10_0$ to $10_3$ for input and output of write data and read data.

The operation of writing of data in the memory cell array 3 and reading of data from the memory cell array will now be described.

For reading data from the memory cell array 3, address signals $A_0, A_1, \ldots, A_n$ are supplied from outside of the RAM to the row address buffer 1 and the column address buffer 4. The row address buffer 1 controlled by the row control signal $\overline{RAS}$ reads the row address from the address signals $A_0, A_1, \ldots, A_n$, and the row address is decoded by the row address decoder 2, so that one of the word lines WL is activated. Then data stored in the memory cells 3a connected to the activated word line WL are output to the pairs of bit lines BL. The data read onto the pairs of bit lines BL are sensed and amplified by the sense amplifiers, not shown.

The column address buffer 4 controlled by the column control signal $\overline{CAS}$ reads the column address from the address signals $A_0, A_1, \ldots, A_n$, and the column address is decoded by the column address decoder 5. Depending on the result of the decoding, the four pairs of the switches in the transfer gate circuit 6 are selected and turned on, and four pairs of bit lines BL thus selected (connected to the selected switches) are connected to the four pairs of I/O bus lines $7_0$ to $7_3$, and the data on the four pairs of the bit lines BL are transferred to the I/O bus lines $7_0$ to $7_3$. The data on the I/O bus lines $7_0$ to $7_3$ are amplified by the data amplifiers $8_0$ to $8_3$, and output via the I/O buffer circuits $9_0$ to $9_3$, and the I/O terminals $10_0$ to $10_3$, to outside of the RAM.

For writing data, the data to be written are supplied from outside of the RAM to the I/O terminals $10_0$ to $10_3$. The data are then read by the I/O buffer circuits $9_0$ to $9_3$, and sent to the I/O bus lines $7_0$ to $7_3$. Then, in accordance with the output of the column decoder 5, four pairs of the switches in the transfer gate circuit 6 are selected and turned on and the four pairs of the selected bit lines BL are connected to the four pairs of the I/O bus lines $7_0$ to $7_3$. The data is written in the memory cells 3a connected to the selected word line WL and the four pairs of the selected bit lines BL.

Figure 2:
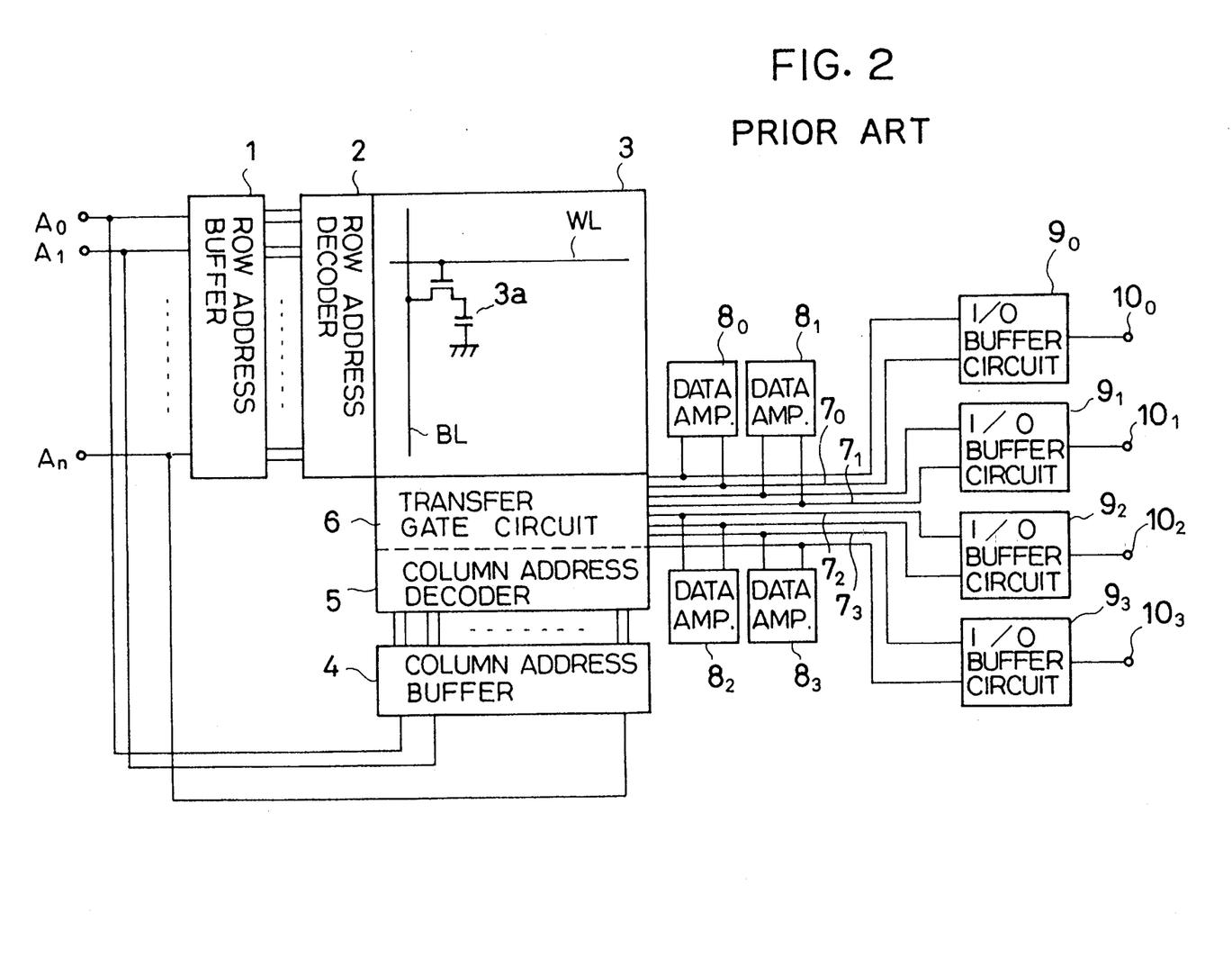
FIG. 2 is a block diagram showing the configuration of a conventional RAM.
Figure 3:
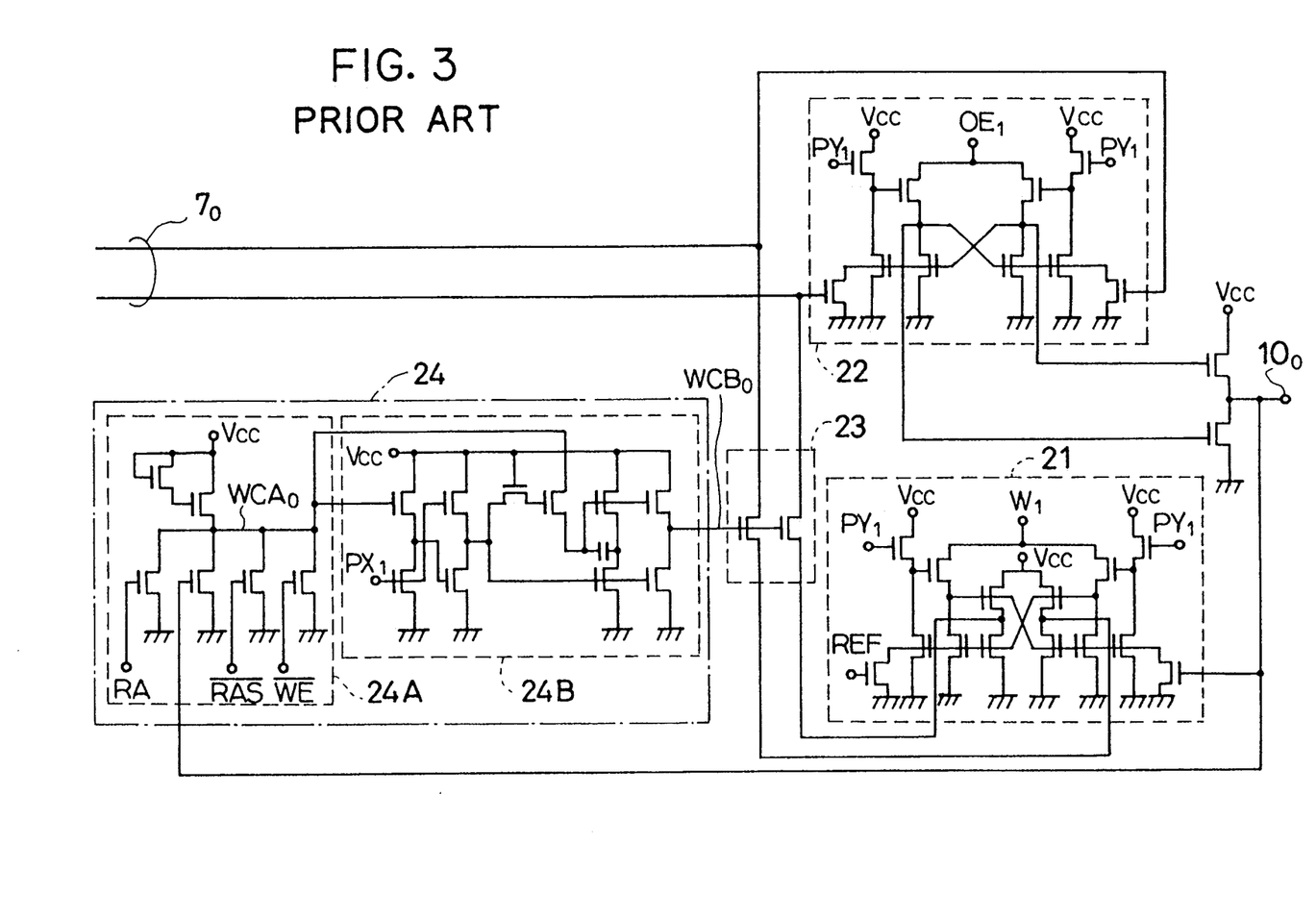
FIG. 3 is a circuit diagram of a conventional I/O buffer circuit of FIG. 2.

FIG. 3 is a circuit diagram showing the I/O buffer circuit $9_0$ of FIG. 2. The other I/O buffer circuits $9_1$ to $9_3$ have an identical configuration.

The I/O buffer circuit $9_0$ comprises an input buffer 21 connected between the I/O terminal $10_0$ and the I/O bus lines $7_0$, and an output buffer 22 connected between the I/O bus lines $7_0$ and the I/O terminal $10_0$. An input control transfer gate 23 connects or disconnects the input buffer 21 and the I/O bus lines $7_0$. The transfer gate 23 is turned on and off by the output of the write inhibit register 24. The write inhibit circuit 24 is formed of a write inhibit sensing circuit 24A and a buffer 24B.

Figure 4:
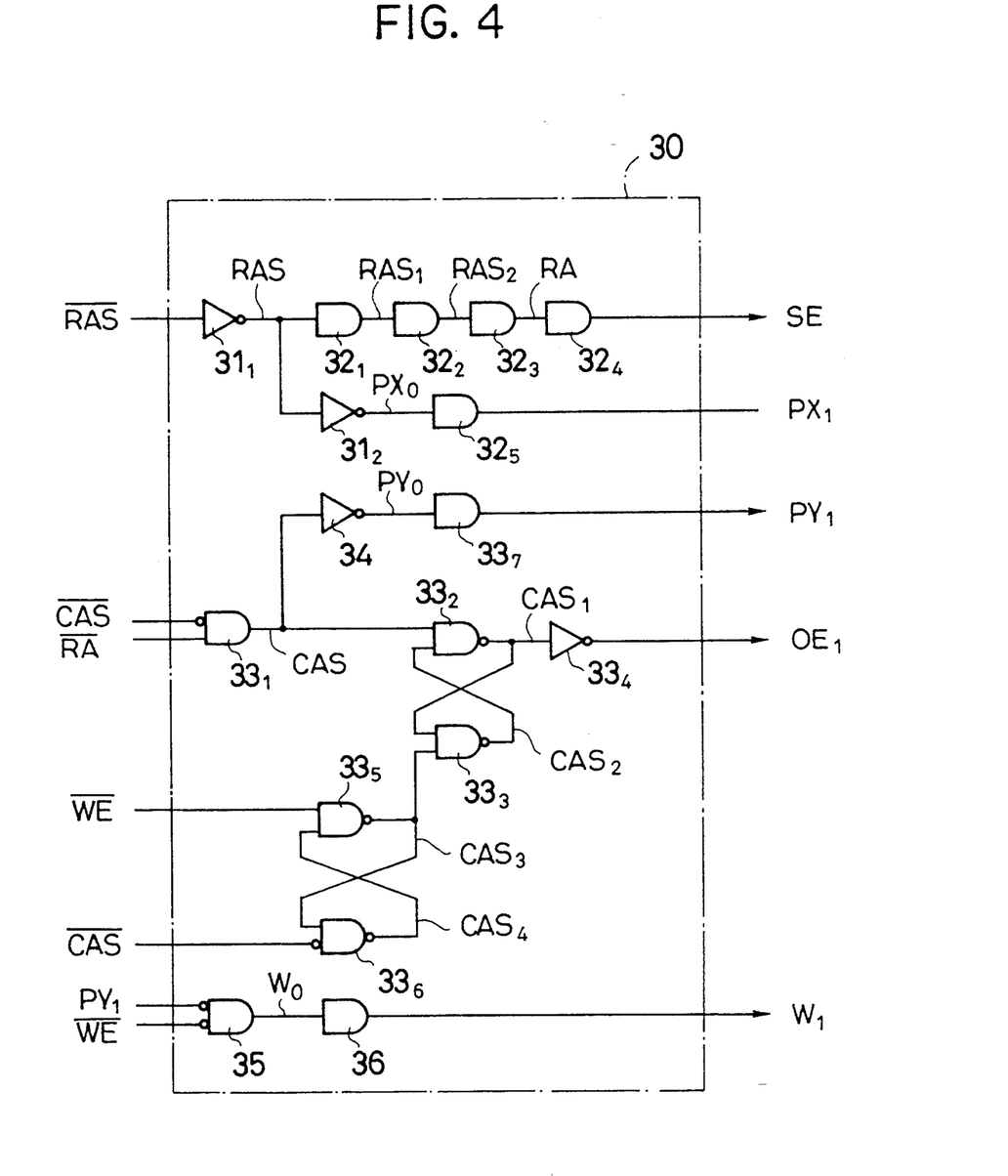
FIG. 4 is a circuit diagram of the control signal generating circuit used for the RAM of FIG. 2.

FIG. 4 is a circuit diagram showing an example of control signal generating circuit for generating various control signals used in FIG. 2 and FIG. 3.

The control signal generating circuit 30 comprises an inverter $31_1$ which receives the row control signal $\overline{RAS}$ and produces a signal RAS (inversion of $\overline{RAS}$), which is passed through buffers $32_1, 32_2, 32_3$ and $32_4$, in turn, and signals RAS$_1$, RAS$_2$, RA and SE are obtained at the outputs of the respective buffers. The signal RAS is also inverted by an inverter $31_2$ and then passed through a buffer $32_5$, and a precharge signal PX$_0$ and another precharge signal PX$_1$ are obtained at the outputs of the inverter $31_2$ and the buffer $32_5$.

An AND gate $33_1$ determines the logical product of a word line activation signal RA and the inversion of the column control signal $\overline{CAS}$, and a signal CAS is obtained at the output of the AND gate $33_1$.

An inversion of the column control signal $\overline{CAS}$ is input to a NAND gate $33_6$, and its output signal CAS4 and a write control signal $\overline{WE}$ are input to a NAND gate $33_5$. The output signal CAS$_3$ of the NAND gate $33_5$ is input to the NAND gate $33_6$, and to a NAND gate $33_3$. The output signal CAS$_2$ of the NAND gate $33_3$ and the signal CAS are input to a NAND gate $33_2$, whose output signal CAS$_1$ is input to the NAND gate $33_3$, and to an inverter $33_4$. An output enable control signal OE1 is obtained at the output signal of the inverter $33_4$.

The signal CAS is inverted by an inverter 34, and is passed through a buffer $33_7$, and a precharge signal PY$_0$ and another precharge signal PY$_1$ are obtained at the outputs of the respective circuits.

An AND gate 35 determines the logical product of the inversion of the precharge signal PY$_1$ and the inversion of the write control signal $\overline{WE}$, and produces a signal $W_0$, which is passed through a buffer 36, and a signal $W_1$ is obtained at the output of the buffer 36.

Referring again to FIG. 3, REF in the input buffer 31 denotes a reference signal, $WCA_0$ in the write inhibit register 24 is an output signal of the inhibit sensing circuit 24A, and $WCB_0$ denotes an output signal of the buffer 24B.

Figure 5:
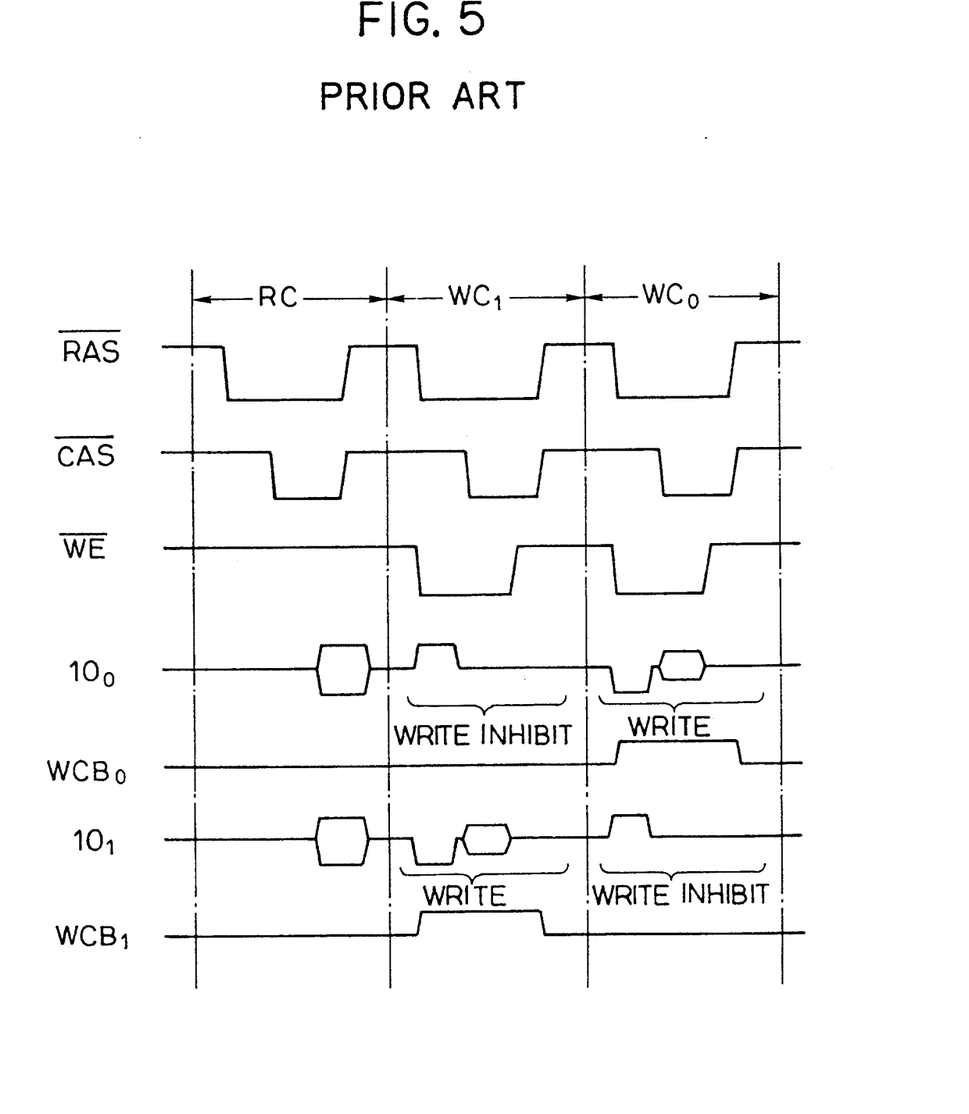
FIG. 5 is a timing chart showing the operation of the circuit shown in FIG. 2 and FIG. 3.

FIG. 5 is a timing chart showing the operating of the circuits of FIG. 2 and FIG. 3. The operation of the circuit of FIG. 3 is first described with reference to FIG. 5.

During reading (read cycle RC in FIG. 5), the input buffer 21 is inactive because the signal $W_1$ is kept Low throughout each read cycle. The output signal $WCA_0$ of the write inhibit sensing circuit 24A is inactive because the write control signal $\overline{WE}$ is kept High, and the output signal $WCB_0$ is therefore kept Low throughout each read cycle. As a result, the input control transfer gate 23 is off. Read data of the selected pairs of bit lines BL is output to the I/O bus lines $7_0$, and output via the output buffer 22 and the I/O terminal $10_0$.

During writing (write cycles $WC_0$ and $WC_1$ in FIG. 5), the write inhibit sensing circuit 24A identifies the write cycle on the basis of the write control signal $\overline{WE}$ after the falling edge of the column control signal $\overline{CAS}$. The write inhibit sensing circuit 24A also determines whether writing is to be inhibited on the basis of the write control signal $\overline{WE}$ and the level of a signal applied from outside of the RAM to the I/O terminal $10_0$ at the falling edge of the row control signal $\overline{RAS}$. The output signal $WCA_0$ is passed through the buffer 24B, and its output $WCB_0$ turns on the input control transfer gate 23 to permit writing of data.

That is, if, at the time of the falling edge of the row control signal $\overline{RAS}$, the write control signal $\overline{WE}$ is Low (Active) and the signal applied to the I/O terminal $10_0$ is also Low (Active), as shown in the write cycle $WC_0$ in FIG. 5, the output signal $WCA_0$ goes High, which is passed through the buffer 24B. The output $WCB_0$ of the buffer 24B, which therefore goes High turns on the transfer gate 23. As a result, the output of the input buffer 21 is connected to the I/O bus lines $7_0$, and normal writing operation is enabled.

If, at the time of the falling edge of the row control signal $\overline{RAS}$, the signal applied to the I/O terminal $10_0$ is made High, as shown in the write cycle $WC_1$ in FIG. 5, then the output signal $WCB_0$ of the buffer 24B is maintained Low. As a result, the transfer gate 23 is off and the output of the input buffer 21 is not connected with the I/O bus lines $7_0$. In this state, even if a write data is applied to the I/O terminal $10_0$ during the period when the $\overline{CAS}$ is Low, writing of data onto the I/O bus lines $7_0$ (and hence in the memory cell 3a) is inhibited.

FIG. 5 also shows the signal applied to another I/O terminal $10_1$ and the output signal $WC_1$ of the write inhibit register 24 in another I/O buffer circuit $9_1$ corresponding to the I/O terminal $10_1$. It will be seen that in the write cycle $WC_0$ when writing through the I/O buffer circuit $9_0$ is permitted, writing through the I/O buffer circuit $9_1$ is inhibited. In the write cycle $WC_1$ when writing through the I/O buffer circuit $9_1$ is permitted, writing through the I/O buffer circuit $9_0$ is inhibited. In this way, the RAM can operate in a write-per-bit mode, in which writing is permitted through only the designated ones of the I/O buffer circuits $9_0$ to $9_3$ while writing through other I/O buffer circuits is inhibited.

Thus, by the function of the write inhibit register 24 and the transfer gate 23, control for independent writing of each of the I/O terminals $10_0$ to $10_3$ is realized without sacrificing the normal memory function.

In the RAM of the above configuration, when a special timing, such as the one for read-modify-write, is adopted for the purpose of enhancing the versatility of the system, unnecessary data output is performed onto the I/O terminals $10_0$ to $10_3$ which are not conducting the writing operation. As a result, the power consumption at the time of output is increased.

SUMMARY OF THE INVENTION

An object of the invention is to provide a RAM having multiple bit I/O terminals, with reduced power consumption at the time of output.

A random access memory according to the invention comprises:
- a plurality of memory cells (3a);
- a plurality of pairs of input/output bus lines ($7_0$ to $7_3$) transferring write data to the memory cells and read data from the memory cells;
- a plurality of input/output terminals ($10_0$ to $10_3$) respectively corresponding to said pairs of input/output bus lines;
- a plurality of input/output buffer circuits ($9_0$ to $9_3$) respectively corresponding to the input/output terminals and also corresponding to said input/output bus lines, and transmitting write data input through the corresponding input/output terminal to the corresponding pair of input/output bus lines, and outputting read data on the corresponding pair of input/output bus lines to the corresponding input/output terminal;
- wherein each of said input/output buffer circuits ($9_0$ to $9_3$) comprises:
- an output buffer (50) for amplifying the read data on the corresponding one of said pairs of input/output bus lines, and outputting the amplified read data to the corresponding one of said input/output terminals ($10_0$ to $10_3$);
- an output transfer gate (70) being made conductive or nonconductive for connecting or disconnecting the corresponding one of said pairs of input/output bus lines and said output buffer; and
- an access control circuit for making nonconductive said output transfer gate to inhibit reading through said input/output buffer circuit, on the basis of an access control signal applied to one of said input/output terminals.

DETAILED DESCRIPTION OF THE PREFERRED EMBODIMENTS

The overall configuration of a RAM of an embodiment of the invention is identical to that described with reference to FIG. 2. It differs from the conventional RAM in the configuration of the I/O buffer circuits $9_0$ to $9_3$. The following description is therefore directed mainly to one of the I/O buffer circuits, denoted by $9_0$ in FIG. 2. The other I/O buffer circuits $9_1$ to $9_3$ have an identical configuration.

Figure 1:
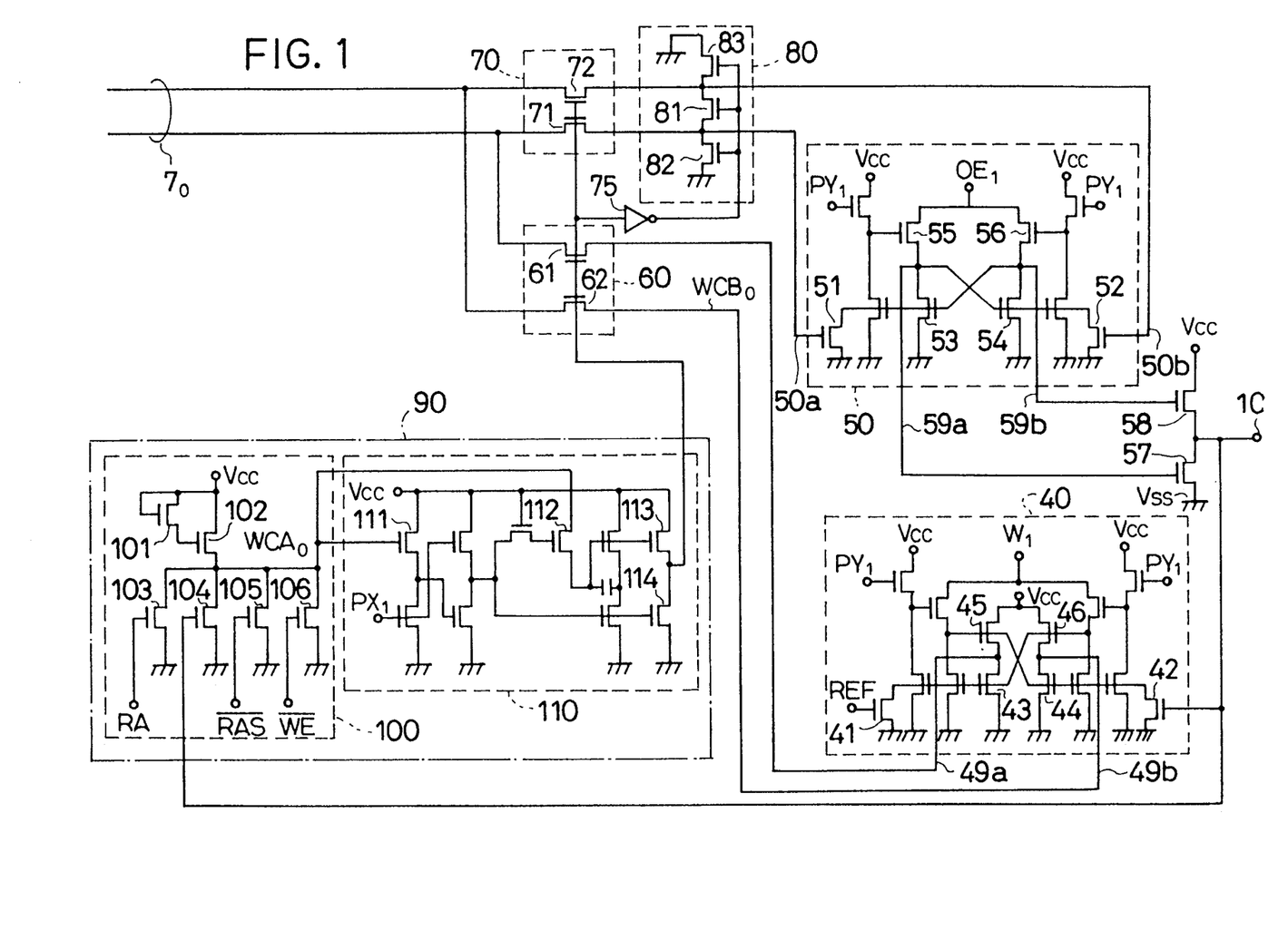
FIG. 1 is circuit diagram showing an I/O buffer circuit provided in a RAM having multiple-bit I/O terminals of an embodiment of the invention.

As shown in FIG. 1, the I/O buffer circuit $9_0$ is formed of MOS transistors, like the circuit of FIG. 3. It comprises an input buffer 40 having its input node connected to the I/O terminal $10_0$ to amplify the write data applied to the I/O terminal $10_0$, before transferring it onto the I/O bus lines $7_0$. The input buffer 40 is precharged responsive to the precharge signal $PY_1$. It is activated responsive to the signal W1, like the circuit of FIG. 3. That is, it is made active when the input buffer activation signal W1 is High, and made inactive when the input buffer activation signal W1 is Low. It comprises an input transistor 41 turned on and off by a reference signal REF, and an input transistor 42 turned on and off by the write data via the I/O terminal $10_0$. The signals input via the transistors 41, and 42 are differentially amplified by the transistors 43, 44, 45 and 46, so that the write data via the I/O terminal $10_0$ is converted into a pair of complementary signals, which are output via output nodes 49a and 49b.

Connected between the output nodes 49a and 49b of the input buffer 40 and the pair of I/O bus lines $7_0$ is an input control transfer gate 60 which comprises a pair of transistors 61 and 62 respectively connecting and disconnecting the output nodes 49a and 49b, and the I/O bus lines $7_0$, and selectively permits the transfer of the write data from the input buffer 40 to the I/O bus lines $7_0$.

An output buffer 50 amplifies read data from the I/O bus lines $7_0$. It comprises input transistors 51 and 52 for receiving the read data from the I/O bus lines $7_0$ via input nodes 50a and 50b, and transistors 53 to 56 which differentially amplifies the read data. The read data which the output buffer 50 receives from the I/O bus lines $7_0$ is in the form of a pair of complementary signals I/O bus lines $7_0$.

The amplified signals are applied, via output nodes 59a and 59b, to the gates of output transistors 57 and 58 to turn on or off the output transistors 57 and 58. The output transistors 57 and 58 are connected in series between the power supply node $V_{CC}$ and the ground potential node $V_{SS}$. The output of the series-connected transistors 57 and 58, i.e., the junction between them is connected to the I/O terminal $10_0$. The series-connected output transistors 57 and 58 thus converts the pair of complementary signals into a signal on a single conductor that is suitable for output through the I/O terminal $10_0$.

The output buffer 50 is precharged responsive to the precharge signal $PY_1$. It is activated by the signal OE1, like the circuit of FIG. 3. That is, it is made active when the output enable signal OE1 is High, and made inactive when the output enable signal OE1 is Low.

Connected between the I/O bus lines $7_0$ and the input nodes 50a and 50b of the output buffer 50 are an output control transfer gate 70 and an equalizer circuit 80. The output control transfer gate 70 comprises a pair of transistors 71 and 72 respectively connecting and disconnecting the I/O bus lines $7_0$, and the input nodes 50a and 50b of the output buffer 50, and selectively permits the transfer of the read data from the I/O bus lines $7_0$ to the output buffer 50.

The equalizer circuit 80 comprises transistors 81, 82 and 83 which are turned on when the output control transfer gate 70 is off to equalize the potentials of the input nodes of the input buffer control transfer gate 60 and to set the potentials at $V_{SS}$ (ground potential). The transistors 81 connects and disconnect the input nodes of the output buffer 50 with each other. The transistor 82 connects and disconnects a first one 50a of the input nodes of the output buffer 50 and the ground node. The transistor 83 connects and disconnects the other input node 50b of the output buffer 50 and the ground node.

The gates of the transistors 61, 62, 71 and 72 are connected to receive the output signal $WCB_0$ from an access control circuit 90, which is identical to the write inhibit register 24 of FIG. 3. The gates of the transistors 81 to 83 are connected to receive the output signal $WCB_0$ via an inverter 75.

The input control transfer gate 60, the output control transfer gate 70 and the equalizer circuit 80 are turned on and off in accordance with an output signal $WCB_0$. Specifically, when the signal $WCB_0$ is High, the transistors 61, 62, 71 and 72 of the transfer gates 60 and 70 are on while the transistors 81 to 83 of the equalizer circuit 80 are off. When the signal $WCB_0$ is Low, the transistors 61, 62, 71 and 72 of the transfer gates 60 and 70 are off while the transistors 81 to 83 of the equalizer circuit 80 are on.

The access control signal sensing circuit 100 discriminates between the write permission and inhibition of access for each cycle in accordance with an the access control signal applied to the I/O terminal $10_0$ at the falling edge of the row control signal $\overline{RAS}$.

The access control circuit 90 is composed of a write access control signal sensing circuit 100 and a buffer 110, which are respectively identical to the write inhibit sensing circuit 24A and the buffer 24B of FIG. 3.

The access control signal sensing circuit 100 comprises pull-up transistors 101 and 102, a transistor 103 turning on and off in accordance with the word line activation signal RA, a transistor 104 turning on and off in accordance with the level of the access control signal applied to the I/O terminal $10_0$, a transistor 105 turning on and off in accordance with the row control signal $\overline{RAS}$, and a transistor 106 turning on and off in accordance with the write control signal $\overline{WE}$. The transistors 103, 104, 105 and 106 together form a four-input NOR gate. That is, its output is Low if one or more of its inputs are High. The output of the NOR gate, denoted by $WCA_0$ is sent to the buffer 110.

The buffer 110 is precharged responsive to a precharge signal $PX_1$, and comprises input transistors 111 and 112 receiving the output signal $WCA_0$ of the access control signal sensing circuit 100 and output transistors 113 and 114 for amplifying the output of the input transistors 111 and 112, and producing the output signal $WCB_0$. The buffer 110 also has the function of maintaining its High output $WCB_0$ until near the end of the each cycle, e.g., until the rising edge of the row control signal ($\overline{RAS}$), if the signal $WCA_0$ is once raised (even for a short period). That is, the output $WCA_0$ of the access control signal sensing circuit 110 can be made High only for a short period after the row control signal goes Low and before the signal RA goes High, and the buffer circuit 110 senses such a short High signal and keeps producing a High signal until the transfer of the read or write data through the transfer gate 60 or 70 is completed.

Figure 6:
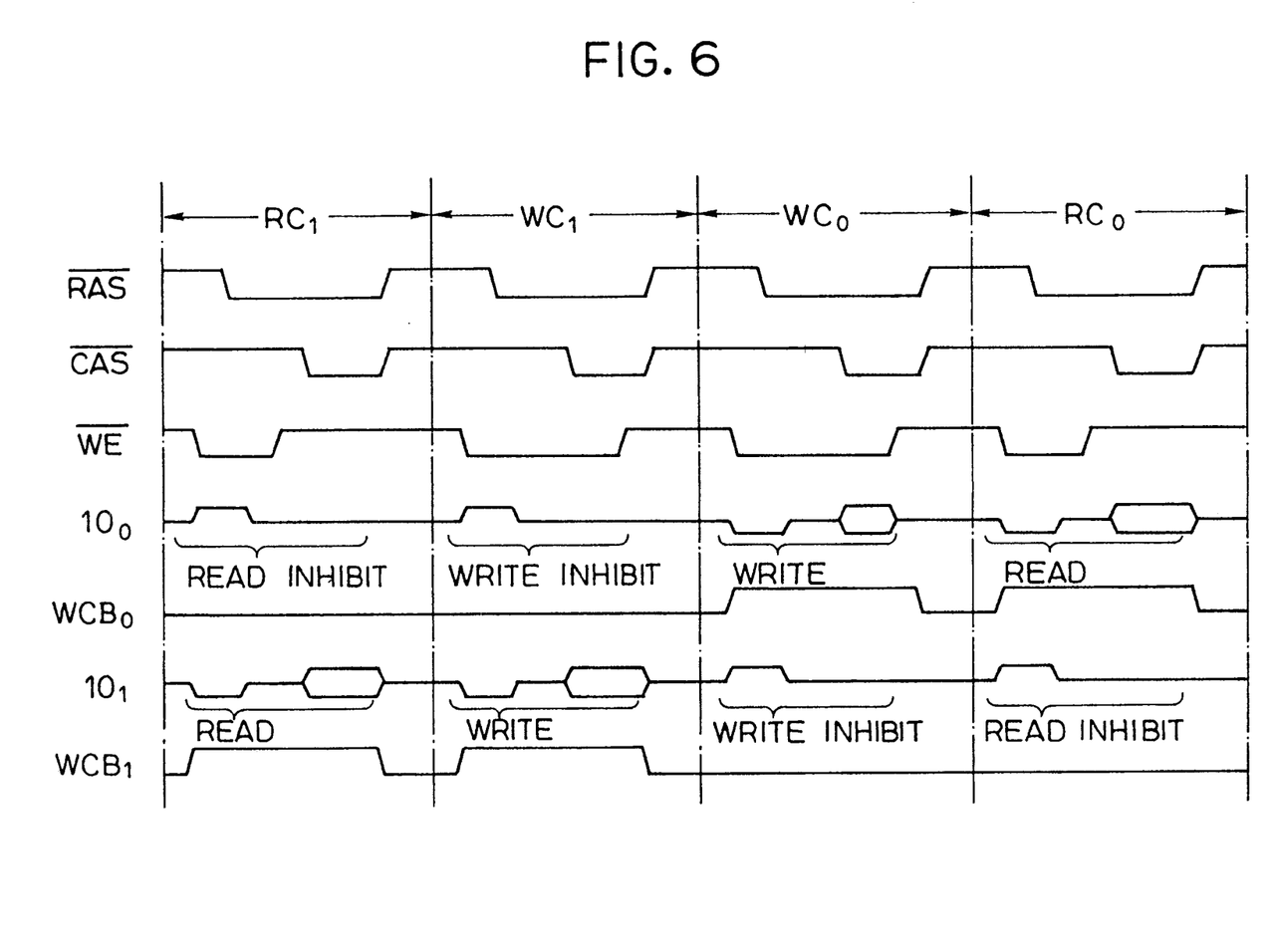
FIG. 6 is a timing chart showing the operation of the circuit shown in FIG. 1 and FIG. 2.

The overall operation of the access control circuit 90 is such that:

its output $WCB_0$ goes High (Active) if
(a) the write control signal $\overline{WE}$ is Low (Active) and the access control signal is also Low (Active) at the falling edge of the row control signal $\overline{RAS}$,
and is kept High until the rising edge of the row control signal $\overline{RAS}$, as shown in the write cycle $WC_0$ and the read cycle $RC_0$ in FIG. 6;
while the output $WCB_0$ is kept Low if the above condition (a) is not satisfied, as shown in the write cycle $WC_1$ and the read cycle $RC_1$ in FIG. 6.

To this end, the write control signal $\overline{WE}$ is made Low, in a read cycle, for a period during which the $\overline{RAS}$ goes Low. The write control signal $\overline{WE}$ goes High before the column control signal $\overline{CAS}$ goes Low in a read cycle, while the write control signal $\overline{WE}$ goes High at the rising edge of the row control signal $\overline{RAS}$ in a write cycle. The access control signal is made Low (Active) if writing or reading is to be permitted in the particular cycle. The access control signal is made High (Inactive) if writing or reading is to be inhibited in the particular cycle.

The control signals shown in FIG. 1 are generated from the control signal generating circuit of FIG. 4, which is also used in the conventional RAM.

The operation of the RAM of FIG. 2 with the I/O buffer circuit $9_0$ of FIG. 1 will now be described with reference to FIG. 6. In each cycle ($RC_1$, $WC_1$, $WC_0$, $RC_1$ in FIG. 6: regardless of whether it is a read cycle or a write cycle), the row control signal $\overline{RAS}$ is made Low for a certain period, and the column control signal $\overline{CAS}$ is made Low for the latter part of the period over which the row control signal $\overline{RAS}$ is low. Discrimination between the write cycle and the read cycle is made on the basis of the write control signal $\overline{WE}$ in the latter part of each cycle: if the write control signal $\overline{WE}$ is Low in the latter part of the cycle, when the column control signal $\overline{CAS}$ is Low, then the cycle in question is a write cycle: otherwise it is a read cycle. Discrimination between permission and inhibition of access is made on the basis of the access control signal applied to the I/O terminal $10_0$ in the former part of each cycle, i.e., for a period during which the row control signal $\overline{RAS}$ goes Low, as well as the write control signal $\overline{WE}$ at the falling edge of the row control signal $\overline{RAS}$. In the latter part of the cycle, the same I/O terminal $10_0$ may be used for input of a write data, or for output of a read data. The access control signal is made Low (Active) when the access through the corresponding I/O buffer circuit $9_0$ during the same cycle is to be permitted, and made High (Inactive) if such access is to be inhibited.

In each write cycle ($WC_0$, $WC_1$), the write control signal $\overline{WE}$ is made Low before the falling edge of the row control signal $\overline{RAS}$. An output enable control signal OE1 is kept Low in each write cycle. The input buffer activation signal W1 is High for the former part of the period in which the column address signal $\overline{CAS}$ is Low.

In a write cycle $WC_0$ in which writing through an I/O buffer circuit $9_0$ is to be permitted, the access control signal is made Low. The output signal $WCB_0$ goes High at the falling edge of the row control signal $\overline{RAS}$ and is maintained High until the rising edge of the row control signal $\overline{RAS}$. As a result, the transfer gate 60 is turned on and the data that is applied to the I/O terminal $10_0$ during the latter part of the write cycle, i.e., a period which begins after the application of the access control signal is terminated, and during which the column control signal $\overline{CAS}$ falls, is transferred through the transfer gate 60 to the I/O bus lines $7_0$. During this period, the input buffer 40 is activated by the signal W1, and therefore amplifies the data applied to the I/O terminal $10_0$, and the amplified data is then supplied to the I/O bus lines $7_0$ through the transfer gate 60.

The data having been transmitted to the I/O bus lines $7_0$ is then written through bit lines into the memory cell $3a$ connected to the selected word and bit lines. The writing may take place at only one memory cell or at a plurality of memory cells. This depends on whether the Low (Active) access control signal is applied to one or more of the I/O terminals ($10_0$ to $10_3$) at the falling edge of the row control signal $\overline{RAS}$.

When the output signal $WCB_0$ is High, not only the input control transfer gate 60, but also the output control transfer gate 70 is turned on. However, the output buffer 50 is inactive because the output enable control signal OE1 is Low.

In the same write cycle $WC_0$, the access control signal applied to another I/O terminal $10_1$ may be High, and writing through the corresponding I/O buffer circuit $9_1$ may be inhibited.

In a write cycle $WC_1$ in which writing through the I/O buffer circuit $9_0$ is to be inhibited, the access control signal applied to the I/O terminal $10_0$ is made High. The output signal $WCB_0$ is kept Low. As a result, the transfer gate 60 is kept off and even if data is applied to the I/O terminal $10_0$ during the latter part of the write cycle, transfer of the data through the transfer gate 60 to the I/O bus lines $7_0$ is inhibited.

In the same write cycle $WC_1$, the access control signal applied to another I/O terminal $10_1$ may be Low, and writing through the corresponding I/O buffer circuit $9_1$ may be permitted.

In each read cycle ($RC_0$, $RC_1$), the write control signal $\overline{WE}$ is made Low in a period (former part of the read cycle) in which the row control signal $\overline{RAS}$ goes Low, and is thereafter made High and maintained High over a period (latter part of the read cycle) when the read data is amplified by the output buffer 50. The output enable control signal OE1 is made Low. The input buffer activation signal W1 is kept Low.

Data is read from a selected memory cell onto the pair of bit lines to which the selected memory cell is connected, and amplified by the sense amplifier, not shown, connected to the pair of bit lines, and transferred through a transfer gate, not shown, to the I/O bus lines $7_0$.

In a read cycle $RC_0$ in which reading through an I/O buffer circuit $9_0$ is to be permitted, the access control signal applied to the corresponding I/O terminal $10_0$ is made Low. The output signal $WCB_0$ goes High at the falling edge of the row control signal $\overline{RAS}$ and is maintained High until the rising edge of the row control signal $\overline{RAS}$. As a result, the transfer gate 70 is turned on and the transistors 81 to 83 in the equalizer circuit 80 are turned off, so that the read data on the I/O bus lines $7_0$ is transferred to the output buffer 50. The output buffer 50 is activated by the output enable control signal OE1, and amplifies the read data. The amplified data is transferred through the output transistors 57 and 58 to the I/O terminal $10_0$. The input control transfer gate 60 is also on but the input buffer 40 is not activated because of the activation signal W1 being Low.

In the same read cycle $RC_0$, the access control signal applied to another I/O terminal $10_1$ may be High, and reading through the corresponding I/O buffer circuit $9_1$ may be inhibited.

In a read cycle $RC_1$ in which reading through the I/O buffer circuit $9_0$ is to be inhibited, the access control signal applied to the corresponding I/O terminal $10_0$ is made High. The output signal $WCB_0$ is kept Low. As a result, the transfer gate 70 is kept off, and transfer of the data from the I/O bus lines $7_0$ through the transfer gate 70 to the output buffer 50 is inhibited. Moreover, as the output signal $WCB_0$ is Low, the transistors 81 to 83 in the equalizer circuit 80 are turned on, so that the input nodes of the output buffer 50 are both set at the ground potential $V_{SS}$, so malfunction of the output buffer 50 is prevented.

In the same read cycle $RC_1$, the access control signal may be applied to another I/O terminal $10_1$ Low, and reading through the corresponding I/O buffer circuit $9_1$ may be permitted.

As described above, an output transfer gate 70 is provided between the I/O bus lines $7_0$ and the input nodes of the output buffer 50, and the transfer gate 70 can be made on or off in accordance with the output signal $WCB_0$ of the access control circuit 90, which in turn depends on the access control signal applied to the I/O terminal $10_0$. Similar control is made with respect to other I/O buffer circuits $9_1$ to $9_3$. Accordingly, the read data is output only through those of the I/O buffers $9_0$ to $9_3$ corresponding to the I/O terminals $10_0$ to $10_3$ to which the Low access control signal is applied in the former part of each cycle. The consumption current at the time of reading operation can therefore be reduced.

The invention is not limited to the above embodiment, but various modifications are possible, as exemplified below:

(a) In the above embodiment, description is made with respect to the case of 4-bit I/O terminals $10_0$ to $10_3$, as illustrated in FIG. 2. But the number of the bits can be other than four.

(b) The input buffer 40, the output buffer 50, the input transfer gate 60, the output transfer gate 70, the equalizer circuit 80, and the access control circuit 90 forming the buffer circuit $9_0$ can be formed of other types of transistors, or of circuit configurations other than those illustrated.

(c) In the embodiment described, the access control signal for permitting access through each of the I/O buffer circuits is applied to the corresponding I/O terminal. But it is also possible to apply the access control signal for control over each of the I/O buffer circuits to an I/O terminal corresponding to another I/O buffer circuit.

As has been described, an output transfer gate controlled by the output of an access control circuit is provided between the I/O bus lines and the input of the output buffer, so in a RAM having multiple-bit I/O terminals, not only the input control transfer gate but also the output control transfer gate are controlled by use of the control signal output from the access control circuit. As a result, only such read data of the arbitrary bit that is desired can be output through the I/O terminal by the use of the output control transfer gate. Consequently, the power consumption for the reading operation can be reduced.

What is claimed is:

1. A random access memory having:
   a plurality of cells;
   a plurality of pairs of input/output bus lines transferring write data to the memory cells and read data from the memory cells;
   a plurality of input/output terminals respectively corresponding to said pairs of input/output bus lines;
   a plurality of input/output buffer circuits respectively corresponding to the input/output terminals and corresponding also to said input/output bus lines, each said buffer circuit being connected for transmitting write data input through the corresponding input/output terminal to the corresponding pair of input/output bus lines, and outputting read data on the corresponding pair of input/output bus lines to the corresponding input/output terminal;
   wherein each of said input/output buffer circuits respectively comprises:
   an output buffer connected for amplifying the read data on the corresponding input/output bus lines, and outputting amplified read data to the corresponding input/output terminal;
   an output transfer gate selectively coupling and decoupling the corresponding pair of input/output bus lines with the corresponding said output buffer;
   a selectively actuatable equalizing circuit connected to the corresponding pair of input/output bus lines for selectively connecting said one pair of input/output bus lines together in its operation mode; and
   an access control circuit connected to control said output transfer gate to inhibit reading through said input/output buffer circuit, the access control circuit being connected to disable said output buffer selectively, on the basis of an access control signal applied to one of said input/output terminals.

2. A random access memory according to claim 1, wherein said access control circuit is also responsive to a write control signal, and determines whether reading of data through the corresponding input/output buffer circuit is to be inhibited, on the basis of the write control signal as well as on the access control signal.

3. A random access memory according to claim 1, wherein
   said access control signal assuming a first state when access is to be permitted and a second state when access is to inhibited; and
   said access control circuit determines whether reading of data through the corresponding input/output buffer circuit is to be inhibited on the basis of whether said access control signal is in said first state or in said second state; and
   said access control circuit makes nonconductive said output transfer gate when said access control signal assumes said second state.

4. A random access memory according to claim 3, wherein said access control circuit makes said determination on the basis of the access control signal applied in a part of each read cycle before read data is output through the input/output terminal.

5. A random access memory according to claim 4, wherein
   said memory receives a row control signal and a column control signal,
   said access control circuit produces an output which goes Active if the access control signal applied to the input/output terminal assumes said first state at the falling edge of the row control signal, and is kept Active until the rising edge of the row control signal, said output of said access control signal otherwise being kept Inactive.

6. A random access memory according to claim 5, wherein said access control circuit is also responsive to a write control signal, and determines whether reading of data through the corresponding input/output buffer circuits is permitted, on the basis of the write control signal as well as on the access control signal.

7. A random access memory according to claim 6, wherein said access control circuit determines that reading through the corresponding input/output buffer circuit is permitted if the write control signal and the access control signal are both Active at the falling edge of the row control signal.

8. A random access memory according to claim 1, wherein each of said input/output buffer circuits further comprises:
- an input buffer for amplifying the write data input through the corresponding one of said input/output terminals and sending the amplified write data to the corresponding one of said pairs of input/output bus lines; and
- an input transfer gate being made conductive or nonconductive for connecting or disconnecting said input buffer circuit and the corresponding one of said pairs of input/output bus lines; wherein
said access control circuit also makes nonconductive said input transfer gate to inhibit writing through said input output buffer circuit, on the basis of the access control signal.

9. A random access memory according to claim 8, wherein said access control circuit makes said determination on the basis of the access control signal applied in a part of the write cycle before input of write data through the input/output terminal.

10. A random access memory according to claim 3, wherein each of said input/output buffer circuits further comprises a means for equalizing the potentials of the lines of the corresponding pair of said input/output data bus lines on when said access control signal assumes said second state.

11. A method of controlling access to a random access memory comprising:
- a plurality of pairs of input/output bus lines transferring write data to memory cells and read data from the memory cells;
- a plurality of input/output terminals respectively corresponding to said pairs of input/output bus lines; and
- a plurality of input/output buffer circuits respectively corresponding to the input/output terminals and also corresponding to said input/output terminals, and transmitting write data input through the corresponding input/output terminal to the corresponding pair of input/output bus lines, and outputting read data on the corresponding pair of input/output bus lines to the corresponding input/output terminal;

said method comprising the steps of:
applying an access control signal for each of the input/output buffer circuits, to one of the input/output terminals in a period in which the input/output terminals are not used for input or output of write data or read data, each of said access control signals assuming a first state when access through the input/output buffer circuit is to be permitted, and a second state when access through the input/output buffer circuit is to be inhibited;
determining for each of the input/output terminals, whether access through the input/output buffer circuit is to be inhibited on the basis of the access control signal; and
inhibiting transfer of said read data through the input/output buffer circuit when said access control signal assumes said second state.

12. A method according to claim 11, wherein said access control signals are applied in a part of each read cycle before read data is output through the input/output terminal.

13. A method according to claim 11, further comprising the step of making a write control signal Active, in a read cycle, for a period during which the row control signal $\overline{RAS}$ goes low; wherein
said step of the determination comprises determining for each of the input/output terminals, whether access through the input/output buffer circuit is to be inhibited on the basis of the write control signal as well as on the access control signal.

14. A random access memory having a plurality of memory cells, a plurality of pairs of bus lines and a plurality of input/output buffer circuits each of which is coupled to a corresponding one of the pairs of bus lines, each of the input/output buffer circuits respectively comprising:
- an input/output terminal;
- an input buffer coupled to said input/output terminal for amplifying write data input through said input/output terminal;
- an output buffer for amplifying read data input through the bus lines;
- an access control circuit coupled to said input/output terminal for generating an access control signal in response to a signal on said input/output terminal;
- a first pair of data lines coupled to said input buffer;
- a second pair of data lines coupled to said output buffer;
- a first switching circuit coupled between the pair of bus lines and said first pair of data lines for electrically coupling the pair of bus lines and said first pair of data lines in response to the access control signal;
- a second switching circuit coupled between the pair of bus lines and said second pair of data lines for electrically coupling the pair of bus lines and said second pair of data lines in response to the access control signal; and
- an output buffer disabling circuit coupled to said second pair of data lines for disabling said output buffer in response to the access control signal.

15. A random access memory according to claim 14, wherein said first switching circuit includes:
- a first MOSFET having a first electrode coupled to one bus line of the pair of bus lines, a second electrode coupled to one data line of said first pair of data lines, and a gate electrode coupled to said access control circuit, and
- a second MOSFET having a first electrode coupled to the other bus line of the pair of bus lines, a second electrode coupled to the other data line of said first pair of data lines, and a gate electrode coupled to said access control circuit.

16. A random access memory according to claim 15, wherein said second switching circuit includes:
- a third MOSFET having a first electrode coupled to one bus line of the pair of bus lines, a second electrode coupled to one data line of said second pair of data lines, and a gate electrode coupled to said access control circuit, and
- a fourth MOSFET having a first electrode coupled to the other bus line of the pair of bus lines, a second electrode coupled to the other data line of said second pair of data lines, and a gate electrode coupled to said access control circuit.

17. A random access memory according to claim 14, wherein said output disabling circuit includes a fifth MOSFET having a first electrode coupled to one data line of the second pair of data lines, a second electrode coupled to the other data line of said second pair of data lines, and a gate electrode coupled to said access control circuit.

18. A random access memory according to claim 17, wherein said output disabling circuit further includes:
- a sixth MOSFET having a first electrode coupled to one data line of the second pair of data lines, a second electrode coupled to a reference voltage source, and a gate electrode coupled to said access control circuit, and
- a seventh MOSFET having a first electrode coupled to the other data line of the pair of the second pair of data lines, a second electrode coupled to the reference voltage source, and a gate electrode coupled to said access control circuit.

19. A semiconductor memory having a plurality of memory cells, a plurality of pairs of bus lines, and a plurality of input/output buffer circuits each of which is coupled to a corresponding one of the pairs of bus lines, each of the input/output buffer circuits respectively comprising:
- an input/output terminal;
- an input buffer coupled to said input/output terminal for amplifying a write signal on said input/output terminal;
- a first pair of data lines coupled to said input buffer;
- a first switching circuit coupled between a pair of bus lines and said first pair of data lines for electrically coupling the pair of bus lines and said first pair of data lines in response to a first control signal;
- an output buffer for amplifying a read signal on the bus lines;
- a second pair of data lines coupled to said output buffer;
- a second switching circuit coupled between the pair of bus lines and said second pair of data lines for electrically coupling the pair of bus lines and said second pair of data lines in response to the first control signal;
- an output buffer disabling circuit coupled to said second pair of data lines for disabling said output buffer in response to a second control signal; and
- an access control circuit coupled to said input/output terminal, said first and second switching circuits, and said output buffer disabling circuit for generating the first and second control signals in response to a signal on said input/output terminal.

20. A semiconductor memory according to claim 19, wherein said first switching circuit includes:
- a first MOSFET having a first electrode coupled to one bus line of the pair of bus lines, a second electrode coupled to one data line of said first pair of data lines, and a gate electrode coupled to said access control circuit, and
- a second MOSFET having a first electrode coupled to the other bus line of the pair of bus lines, a second electrode coupled to the other data line of said first pair of data lines, and a gate electrode coupled to said first control signal.

21. A semiconductor memory according to claim 19, wherein said second switching circuit includes:
- a third MOSFET having a first electrode coupled to one bus line of the pair of bus lines, a second electrode coupled to one data line of said second pair of data lines, and a gate electrode coupled to said first control signal, and
- a fourth MOSFET having a first electrode coupled to the other bus line of the pair of bus lines, a second electrode coupled to the other data line of said second pair of data lines, and a gate electrode coupled to said first control signal.

22. A random access memory according to claim 19, wherein said output disabling circuit has a fifth MOSFET having a first electrode coupled to one data line of the second pair of data lines, a second electrode coupled to the other data line of said second pair of data lines, and a gate electrode coupled to said second control signal.

23. A random access memory according to claim 22, wherein said output disabling circuit further includes:
- a sixth MOSFET having a first electrode coupled to one data line of the second pair of data lines, a second electrode coupled to a reference voltage source, and a gate electrode coupled to said second control signal, and
- a seventh MOSFET having a first electrode coupled to the other data line of the second pair of data lines, a second electrode coupled to the reference voltage source, and a gate electrode coupled to said second control signal.

24. A random access memory according to claim 10, wherein the second control signal is an inverted signal of the first control signal.

* * * * *